United States Patent
Janssen et al.

(10) Patent No.: US 10,389,955 B2
(45) Date of Patent: *Aug. 20, 2019

(54) METHOD FOR DETECTING PARTICULATE RADIATION

(71) Applicant: FEI Company, Hillsboro, OR (US)

(72) Inventors: Bart Jozef Janssen, Eindhoven (NL); Erik Michiel Franken, Nuenen (NL); Maarten Kuijper, Helmond (NL); Lingbo Yu, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/180,242

(22) Filed: Nov. 5, 2018

(65) Prior Publication Data

US 2019/0075258 A1 Mar. 7, 2019

Related U.S. Application Data

(63) Continuation of application No. 15/218,465, filed on Jul. 25, 2016, now Pat. No. 10,122,946.

(30) Foreign Application Priority Data

Nov. 11, 2015 (EP) .................................... 15194118
Mar. 21, 2016 (EP) .................................... 16161322

(51) Int. Cl.
| | | |
|---|---|---|
| *G01T 1/24* | (2006.01) | |
| *G06T 3/40* | (2006.01) | |
| *H04N 5/349* | (2011.01) | |
| *H04N 5/378* | (2011.01) | |
| *H01L 27/146* | (2006.01) | |

(52) U.S. Cl.
CPC ............. *H04N 5/349* (2013.01); *G01T 1/247* (2013.01); *G06T 3/4069* (2013.01); *H01L 27/14659* (2013.01); *H04N 5/378* (2013.01)

(58) Field of Classification Search
CPC ........................................................ G01T 1/247
See application file for complete search history.

(56) References Cited

U.S. PATENT DOCUMENTS

| | | | |
|---|---|---|---|
| 5,654,547 A | 8/1997 | Coene et al. | |
| 5,753,913 A | 5/1998 | Coene et al. | |
| 10,122,946 B2 * | 11/2018 | Janssen | ................ G06T 3/4069 |
| 2010/0266201 A1 | 10/2010 | Cabral et al. | |
| 2011/0155918 A1 | 6/2011 | Bouhnik et al. | |

(Continued)

OTHER PUBLICATIONS

Kim, J. et al., Three-Dimensional Signal Correction on UltraPeRL CZT Detectors, IEEE Nuclear Science Symposium Conference Record, Oct. 1, 2007, pp. 1289-1293.

*Primary Examiner* — Edwin C Gunberg

(57) ABSTRACT

When detecting particulate radiation, such as electrons, with a pixelated detector, a cloud of electron/hole pairs is formed in the detector. Using the signal caused by this cloud of electron/hole pairs, a position of the impact is estimated. When the size of the cloud is comparable to the pixel size, or much smaller, the estimated position shows a strong bias to the center of the pixel and the corners, as well to the middle of the borders. This hinders forming an image with super-resolution. By shifting the position or by attributing the electron to several sub-pixels this bias can be countered, resulting in a more truthful representation.

21 Claims, 1 Drawing Sheet

(56) References Cited

U.S. PATENT DOCUMENTS

| | | |
|---|---|---|
| 2011/0210235 A1 | 9/2011 | Dierickx |
| 2011/0297838 A1 | 12/2011 | Wangerin et al. |
| 2012/0049061 A1 | 3/2012 | Luecken et al. |
| 2012/0273676 A1 | 11/2012 | Kuijper |
| 2013/0093931 A1 | 4/2013 | Janssen et al. |
| 2013/0254948 A1 | 9/2013 | Hartong et al. |
| 2014/0007307 A1 | 1/2014 | Routh et al. |
| 2014/0145077 A1 | 5/2014 | Schoenmakers et al. |
| 2015/0155131 A1 | 6/2015 | Sluijterman et al. |
| 2015/0170876 A1 | 6/2015 | Janssen et al. |
| 2015/0260854 A1 | 9/2015 | Lux et al. |
| 2016/0254119 A1 | 9/2016 | Kontaras et al. |

\* cited by examiner

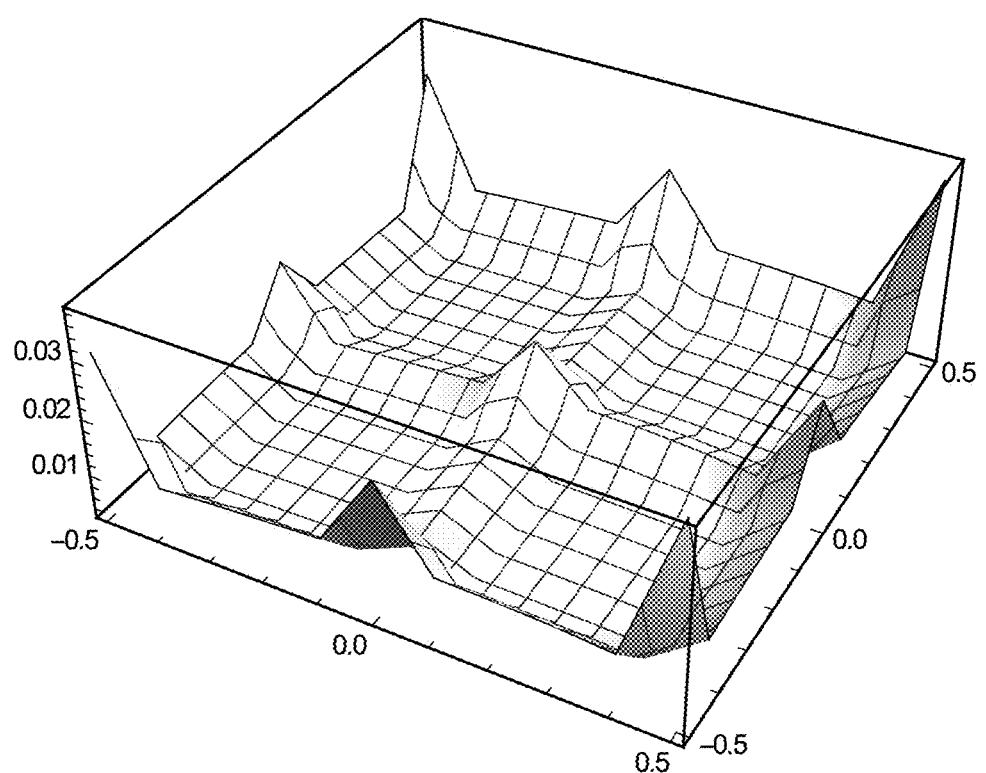

METHOD FOR DETECTING PARTICULATE RADIATION

This application is a Continuation of U.S. application Ser. No. 15/218,465, filed Jul. 25, 2016, which is hereby incorporated by reference.

The invention relates to a method of detecting particulate radiation using a semiconductor based pixelated detector, the detector pixels having a detector pixel size, the detector sensitive to the particulate radiation, each particle of the particulate radiation causing a multitude of electron/hole pairs in the semiconductor material of the detector, the multitude of electron/hole pairs having a centroid and a centroid extent, the extent of the centroid larger than the detector pixel size, the method comprising:

A step of intercepting a particle of the particulate radiation,

A step of estimating the number of electron/hole pairs for a number of adjacent detector pixels, A step of estimating the position of the centroid of the number of electron/hole pairs using the estimates of electron/hole pairs in adjacent detector pixels, A step of estimating the impact position of the particle using said estimated position of the centroid, A step of forming a pixelated image using the estimated position of a multitude of estimated impact positions, the pixelated image consisting of image pixels having an intensity, Such a method is known inter alia from the "K2 Direct Detection Cameras", commercially available from Gatan Inc., 5794 W. Las Positas Blvd., Pleasanton, Calif. 94588, USA.

The known method describes a pixelated detector intercepting radiation in the form of energetic electrons. Each intercepted electron causes a cloud of electron/hole pairs in the semiconductor material of the detector, thereby causing a signal in the detector pixel(s) where it is detected. As the diameter of the cloud (the centroid) is larger than the diameter of the detector pixels, one impinging electron causes a signal in multiple detector pixels. Using the signal of different detector pixels, an estimate of the impact position is determined with a resolution better than the detector's pixel size, in this case with a resolution of half a detector pixel diameter. This is used to form an image with super-resolution (as the resolution is better than the detector pixel size).

The method does not disclose how the impact position is determined or estimated. The method has not proven to give results for a resolution other than half a detector pixel or a (multiple of a) whole detector pixel.

It is noted that in many cases the extent of the centroid can be characterized with a FWHM (Full Width at Half Maximum) diameter.

The invention intends to provide a method with improved resolution and/or signal-to-noise (S/N) ratio compared to the known method.

To that end the method is characterized in that when estimating the impact position said estimate has a position dependent bias depending on the position within the detector pixel, and the contribution of each estimated impact position to corresponding image pixels is adjusted to counter the effect of said position dependent bias.

Inventors found that the response of a detector pixel to an impinging particle not only depends on different responses between pixels (inter-pixel differences or inter-pixel non-uniformity), but that when estimating the position within the detector pixel the probability that a particle is allocated to a position on the detector pixel (the position dependent bias) is non-uniform: said position dependent bias depends (reproducibly) on the position on the detector pixel and thus introduces an intra-pixel non-uniformity).

This can be explained as follows: assume that the extent of the cloud of electron/hole pairs is smaller than the pixel size, then if the adjacent detector pixels show no electron/hole pairs (all electron/hole pairs are generated within one detector pixel) the position will be allocated to the middle of the detector pixel, as there is no ground to allocate it to another position. Only when the particle hits near the border between two detector pixels (thus causing electron/hole pairs in two detector pixels) a position near the border can be determined, but where along the border is unknown: therefore the position of the particle will be associated to the middle of the border. Only near the corners a true positioning in two directions can be performed. For an extent much larger than the detector pixel size the effect (non-uniformity) smears out. For a centroid size (slightly) larger than the pixel size, the estimated positions cluster near the center of the detector pixel, to a lesser extent to the center of the borders, and to the corners.

Inventors experimented to find a solution to counter the effect of said position dependent bias. The most obvious solution coming to mind of the skilled artisan is to attach a lower probability to the events near the peaks. In an image this is realized by scaling the intensity of image pixels corresponding to high probability locations. However, this has no physical basis: such scaling implies that only part of a particle detected at the position with a high probability is imaged. Also, part of the information is lost, resulting in an increase in noise. The method according to the invention, with or without improved resolution, can also be used for improved S/N ratio near the Nyquist frequency (the Nyquist frequency governed by the detector pixel size).

Inventors found that by adjusting the contribution of each impact position to corresponding image pixels to counter the effect of said position dependent bias, the effect of the position dependent bias can be countered.

The contribution of each estimated impact position to corresponding image pixels may comprise the adjustment of the estimated position within the detector pixel, the adjustment a function of the estimated position within the detector pixel. This may be achieved using a mathematical function, preferably a spline function, or using a look-up table (LUT). When using a LUT, the adjustment of the position may be based on one LUT value, or on an interpolation of more than one LUT values. This results in an adjusted estimated position.

Alternatively or additionally the contribution of each estimated impact position to corresponding image pixels may comprise adding intensity to more than one image pixels, the adding a function of the estimated position (or adjusted estimated position) within the detector pixel.

The adding of intensity to more than one image pixel may be derived using a LUT, the LUT values a function of the estimated position within the pixel. The LUT may show a large number of values, each value corresponding to a rounded estimated position. This introduces a (small) rounding in positional information. Preferably the values are derived from an interpolation in the LUT, the interpolation based on the estimated position within the detector pixel. Less rounding is then to be expected. Alternatively the adding of intensity may be derived from a mathematical function, preferably a spline function.

In yet another embodiment the particulate radiation is particulate radiation from the group of electrons, ions, and X-rays It is noted that the invention does not relate to PALM or dSTORM, as these super-resolution methods detect a multitude of particles captured by one pixel, each particle a photon of visible light, each photon causing (at most) one electron/hole pair, followed by determining the centroid of several adjacent pixels.

It is further noted that for Gatan's S2 camera the only known super-resolution setting is half the pixel size. Nowhere does Gatan disclose that the estimated position is shifted to counter clustering at half the pixel size. As the position dependent bias error introduces a non-uniformity at twice the pixel size, this is hard to detect when the super-resolution is set to exactly half the pixel size The method is compatible with particulate radiation from the group of electron, ions, and X-ray photons.

In an embodiment the method further comprises obtaining a pixelated image using the estimates of the impact position of a multitude of particles, the estimate of the impact position of each particle contributing to the intensity of several image pixels.

It is noted that when attributing the detected particle to only one pixel of the image, Moiré effects and interferences can occur. Inventors found that to avoid this, the contribution of each particle is best spread out over several pixels.

It is noted that as long as the point spread function (PSF) used to spread out the contribution is known, this is a reversible method and the original position can be derived by deconvolution of the image intensities and the (known) PSF.

Preferably the several image pixels are adjacent image pixels, but the amount of pixels need not be limited to the image pixels directly bordering the pixel corresponding to the estimated impact position.

It is noted that although particularly useful for the method of the invention, also other methods for detecting particulate radiation may benefit from obtaining a pixelated image using the estimates of the impact position of a multitude of particles, the estimate of the impact position of each particle contributing to the intensity of several image pixels.

The invention is now elucidated using FIG. 1.

To that end FIG. 1 schematically shows the position dependent bias across the pixel. This concerns actual measurements where a large number of electrons impacted on a pixelated detector, the pixelated detector having a pixel size of 14×14 $\mu m^2$, while the FWHM size of the cloud of electron/hole pairs is estimated to be 22 $\mu m$ (1.6 times the pixel size). Note that the irradiation was uniform. Clearly the estimated position is not uniform, indicating that there is a position dependent bias. This position dependent bias can be countered by shifting of the position, using a vector field for each sub-pixel, or using a function where the adjusted position (u,v) is a function of the detected position (x,y), thus (u,v)=F(x,y), or it can be countered by spreading the contribution of one event (impact) over several image pixels or sub-pixels (representing the impact position as a 'blob' contributing to several detector sub-pixels, the blob a position dependent blob. It is noted that one sub-pixel may show a one-to-one relation to an image pixel, or several sub-pixels may contribute to one image pixel. In any event it is favorable to spread the information representing one estimated impact is spread over several image pixels. This spreading over several image pixels (further referred to as spreading) is in itself counter-intuitive, as it gives a result similar to blurring, but the spreading eliminates (or greatly reduces) Moiré-effects and interferences.

It is noted that when using appropriate spreading, and assuming the image is a sparse image (so: in most cases one or no impacts per image pixel) the estimated impact positions can be perfectly retrieved from the image, that is: no positional information is lost. In case of a non-sparse image the positional information of each individual estimated impact cannot be retrieved, but the information is incorporated in the image.

It is further noted that this spreading (effectively a spatial low-pass filter) may be followed by a high-pass filter to improve the image quality (crisp the image) with minimal loss of information.

The shifting and/or spreading should take place before attributing the information to an image pixel. When the spreading is done after combining detector images, information is lost. Shifting after combining is not possible. From this inventors concluded that any correction should be performed on the level where single impact events are handled, ideally by shifting the estimated impact position and spreading the information over several image pixels. A similar (although slightly inferior) result can be achieved when the impact is attributed to a group of detector sub-pixels (the sub-pixels used to construct an image) or a group of image pixels.

If the shift or the spreading is performed with a higher resolution than the image representation, the high-frequency information (for example above half of the Nyquist frequency) is better represented, resulting in an improved S/N ratio.

It is noted that all this does not take away the need to correct for before mentioned inter-pixel differences.

Summarizing, when detecting particulate radiation, such as electrons, with a pixelated detector, a cloud of electron/hole pairs is formed in the detector. Using the signal caused by this cloud of electron/hole pairs a position of the impact is estimated. Inventors found that, when the size of the cloud is comparable to the pixel size, or much smaller, the estimated position shows a strong bias to the center of the pixel and the corners, as well to the middle of the borders. This hinders forming an image with super-resolution. By shifting the position or by attributing the electron to several sub-pixels this bias can be countered, resulting in a more truthful representation. It is noted that shifting and/or spreading should take place before attributing the information to an image pixel, and before adding the events per sub-pixel. When the spreading is done after combining detector images, information is lost. It is noted that shifting after combining detector images is not possible.

What is claimed is:

1. A method of detecting particulate radiation using a semiconductor based pixelated detector, the detector pixels having a detector pixel size, the detector sensitive to the particulate radiation, each particle of the particulate radiation causing a multitude of electron/hole pairs in the semiconductor material of the detector, the multitude of electron/hole pairs having a centroid and a centroid extent, the extent of the centroid extent larger than the detector pixel size, the method comprising:

intercepting a particle of the particulate radiation, detecting charges from the electron/hole cloud at multiple adjacent detector pixels to generate a signal from each of the multiple adjacent detector pixels, the signal having a magnitude corresponding to the number of charges detected, estimating the position of a centroid of the electron/hole cloud using the magnitudes of the signals generated from the multiple adjacent detector pixels, estimating the impact position of the particle using said estimated position of the centroid, said estimated impact position having a position dependent bias depending on the position within the detector pixel, forming a pixelated representation of the radiation using the estimated position of a multitude of estimated impact positions, the pixelated representation consisting of image pixels having an intensity, and countering the effect of said position dependent bias within the adjacent detector pixels.

2. The method of claim 1 in which countering the effect of said position dependent bias within the adjacent detector pixels comprises adjusting the contribution of each estimated impact position to corresponding image pixels.

3. The method of claim 1 in which countering the effect of said position dependent bias within the adjacent detector pixels comprises adjusting the estimated position, the adjustment being a function of the estimated impact position relative to the detector pixel.

4. The method of claim 3 in which the function comprises a spline function.

5. The method of claim 1 in which countering the effect of said position dependent bias within the adjacent detector pixels comprises determining an adjustment from a look-up table (LUT).

6. The method of claim 1 in which countering the effect of said position dependent bias within the adjacent detector pixels comprises adding intensity to more than one image pixel.

7. The method of claim 1 in which the particulate radiation is particulate radiation from selected from the group of electrons, ions, and X-rays.

8. A method of detecting particulate radiation using a semiconductor based pixelated detector having detector pixels, the detector pixels having a detector pixel size, each particle of the particulate radiation causing formation of an electron/hole pair cloud in the semiconductor material of the detector, the cloud having a centroid and an extent, the extent of cloud being larger than the detector pixel size, the method comprising:

(a) intercepting a particle of the particulate radiation, (b) detecting charges from the electron/hole cloud at multiple adjacent detector pixels to generate a signal from each of the multiple adjacent detector pixels, the signal having a magnitude corresponding to the number of charges detected, (c) estimating the position of a centroid of the electron/hole cloud using the magnitudes of the signals generated from the multiple adjacent detector pixels, the estimated position having a position dependent bias depending upon the position of the particle impact within the multiple adjacent detector pixels, and (d) estimating the impact position of the particle using the estimated position of the centroid, including compensation for the position dependent bias.

9. The method of claim 8 further comprising repeating steps (a)-(d) to acquire estimated impact positions of multiple particles and forming a representation of the radiation using the multiple estimated impact positions.

10. The method of claim 9 in which forming a representation of the radiation using the multiple estimated impact positions comprises forming pixelated image.

11. The method of claim 8 in which estimating the position of the centroid of the electron/hole cloud using the signals generated from the multiple adjacent detector pixels includes dividing the detector pixel into multiple image pixels and allocating the signal magnitude of each of the multiple adjacent detector pixels to a single image pixel within the corresponding detector pixel.

12. The method of claim 11 in which compensating for the position dependent bias comprises re-allocating the signal magnitude from the single image pixel to multiple image pixels within the corresponding detector pixel.

13. The method of claim 8 in which compensating for the position dependent bias comprises adjusting the estimated impact position by applying an adjustment that is a function of the estimated position of the centroid relative to the detector pixel.

14. The method of claim 13 in which the function comprises a spline function.

15. The method of claim 13 in which compensating for the position dependent bias comprises determining an adjustment from a look-up table (LUT).

16. The method of claim 8, in which the particulate radiation is particulate radiation from the group of electrons, ions, and X-rays.

17. A method of forming a representation of the particulate radiation impacting onto a semiconductor based pixelated detector having multiple detector pixels, each of the multiple detector pixels corresponding to multiple image pixels, the multiple detector pixels having a detector pixel size, each particle of the particulate radiation causing formation of an electron/hole pair cloud in the semiconductor material of the detector, the cloud having a centroid and an extent, the extent of cloud being larger than the detector pixel size, the method comprising:

(a) intercepting a particle of the particulate radiation, (b) detecting charges from the electron/hole cloud at multiple adjacent detector pixels to generate a signal from each of the multiple adjacent detector pixels, the signal magnitude corresponding to the number of charges detected, (c) allocating the signal magnitude of each detector pixel to multiple image pixels within the detector;

(d) estimating the position of the impact of the particle by determining a centroid of the image pixels within the multiple adjacent detector pixels, the allocation of the signal magnitude to multiple image pixels reducing the position dependent bias of the estimated position of the impact of the particle compared to the position dependent bias created by allocating the signal to a single image pixel, (e) repeating steps (a)-(d) to acquire estimated impact positions of multiple particles and forming a representation of the radiation using the multiple estimated impact positions, and (f) forming a representation of the particulate radiation using the estimated positions of a multitude of impact positions.

18. The method of claim 17 in which allocating the signal magnitude of each detector pixel to multiple image pixels comprises allocating the signal magnitude to a single pixel and then distributing the signal from the single image pixel to multiple image pixels.

19. The method of claim 17 in which allocating the signal magnitude of each detector pixel to multiple image pixels within the detector comprises applying a function from the group of spline functions to the signal magnitude of the corresponding detector pixel.

20. The method of claim 17 in which allocating the signal magnitude of each detector pixel to multiple image pixels within the detector comprises applying a function stored in a look-up table (LUT) to the signal magnitude of the corresponding detector pixel.

21. The method of claim 17, in which the particulate radiation is particulate radiation from the group of electrons, ions, and X-rays.

\* \* \* \* \*